April 21, 1964 V. J. HABISOHN 3,130,326

ELECTRONIC BISTABLE GATE CIRCUIT

Filed Feb. 23, 1961

INVENTOR.
VICTOR J. HABISOHN

BY J. Warren Whitesel

ATTORNEY

United States Patent Office 3,130,326

Patented Apr. 21, 1964

3,130,326

ELECTRONIC BISTABLE GATE CIRCUIT

Victor J. Habisohn, Oak Lawn, Ill., assignor to International Telephone and Telegraph Corporation, New York, N.Y., a corporation of Maryland Filed Feb. 23, 1961, Ser. No. 91,086
3 Claims. (Cl. 307—88.5)

This invention relates to gate circuits and more particularly to electronic bistable gate circuits for selectively applying signals of either of two polarities to output terminals thereof.

Frequently, electrical circuits must provide output signals having either of two polarities depending upon whether an input signal is or is not present. Sometimes, similar output signals are provided by bistable circuits which respond selectively to successive trigger and reset pulses. For example, one circuit of the type described includes relay contacts (sometimes called "C" contacts) having a moving leaf spring which makes an electrical contact with a first stationary leaf spring when the relay is unoperated and with a second stationary leaf spring when the relay is operated. Thus, if negative battery is connected to the first stationary spring and positive battery is connected to the second stationary spring, the potential on the moving spring is negative when the relay is unoperated and positive when it is operated.

With the advent of electronic circuitry, it was found that this type of relay contact assembly cannot always be relied upon to provide a desired electrical function. First, contacts tend to bounce and provide transient signals which can be tolerated in relay circuitry but not in electronic circuitry because each bounce appears as a control pulse. Second, the time required for a relay to operate can not always be meshed into other circuit operations which occur at electronic speeds. Finally, the lives of relays and electronic components are very different so that a sensible and economical maintenance schedule cannot be established when the two types of components are indiscriminately intermixed. However, it has not been easy to replace the relay contacts with electronic circuits which overcome these problems because power transistors and similar components capable of carrying large currents are very expensive. Moreover, the electronic circuitry has tended to become very complex and difficult to build, adjust, and maintain.

Accordingly, one object of this invention is to provide a new and improved bistable electronic, logic gate circuit. More particularly, an object is to provide an electronic circuit for producing the electrical function of a "C" combination relay contact assembly. In this connection, an object is to provide a circuit which produces output pulses of uniform voltage responsive to input pulses of the same voltage.

Another object of this invention is to provide an electronic bistable flip-flop circuit adapted to switch to one of two stable conditions in response to trigger signals and to switch to the other stable condition in response to reset signals. More particularly, an object is to provide a flip-flop circuit of the type described which may be reset from any of a number of controlling circuits.

Still another object is to provide these and other electrical functions with inexpensive, fast acting, reliable semiconductor devices which are presently available in commercially usable quantities. Specifically, an object is to provide these functions through the use of low cost, wide tolerance germanium transistors.

In accordance with one aspect of this invention, an electronic gate circuit is provided with input and output terminals. Included within the gate circuit are a pair of electronic switches, here shown as emitter followers having complementary symmetry and series connected between sources of positive and negative potentials. The emitter electrodes of these switches are connected to the output terminal and the control or base electrodes are connected in a common biasing circuit. Normally, a first of these electronic switches is conductive and the other is non-conductive; therefore, the polarity of a signal appearing at the output terminal is that of the potential source connected to the first or conductive electronic switch. When a pulse is received at the input terminal, the polarity of a control voltage applied to the common biasing circuit is reversed, the first switch is turned "off," and the other switch is turned "on," thereby reversing the polarity of the signal appearing at the output terminal.

In accordance with a further aspect of the invention, the potential appearing at the common biasing circuit is fed back to apply a holding potential at the input terminal when the polarity of the output terminal is reversed. Therefore, the output terminal remains at the reversed polarity until a reset pulse is applied to neutralize or overcome the potential fed back to the input terminal; whereupon, the output potential reverts to its orginal polarity.

The above mentioned and other features and objects of this invention and the manner of obtaining them will become more apparent and the invention itself will be best understood by reference to the following description of an embodiment of the invention taken in conjunction with the accompanying drawing wherein.

Figures 1, 2:
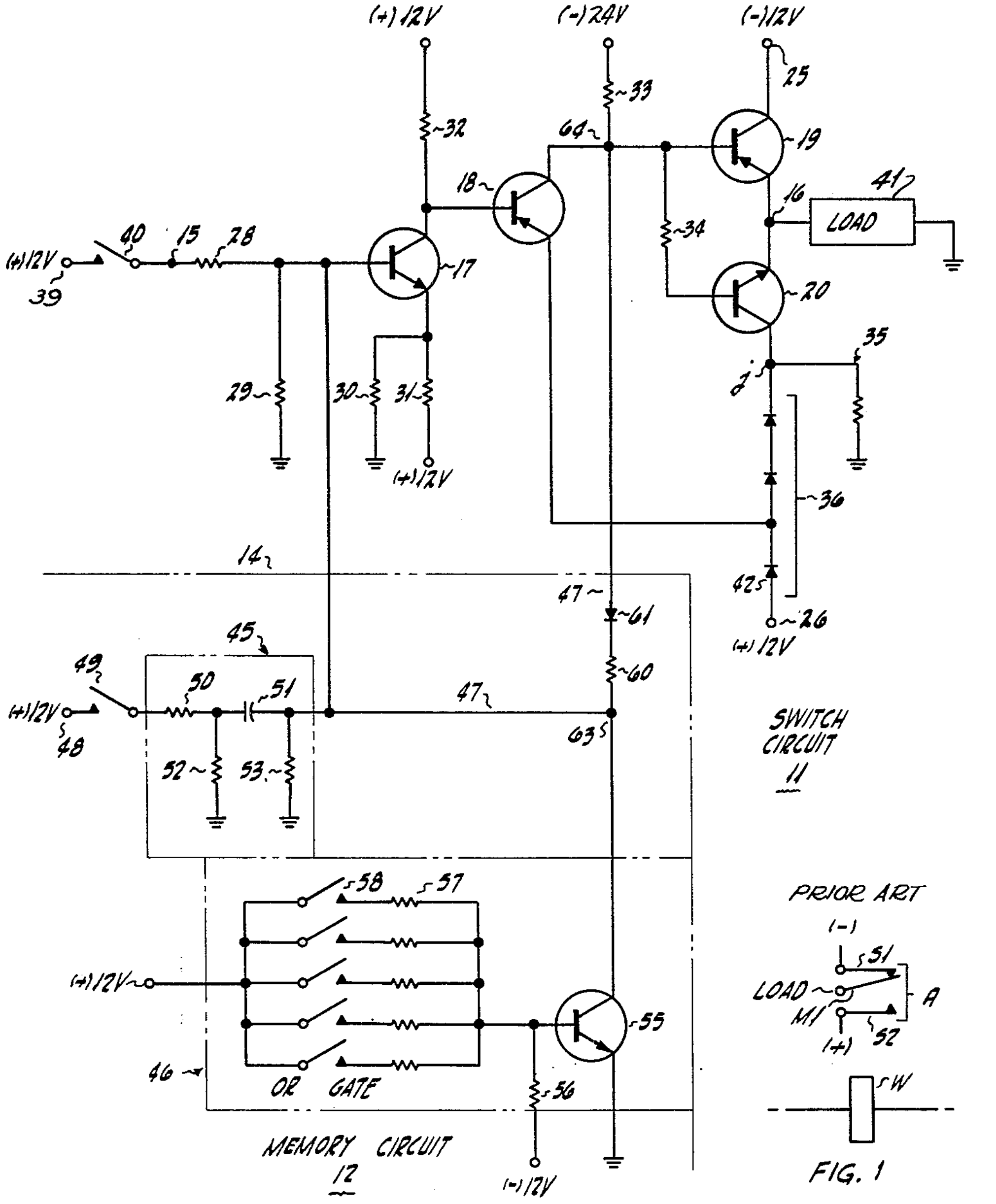
FIG. 1 is a circuit diagram showing a "C" type relay spring combination.
FIG. 2 is a circuit diagram showing details of the bistable electronic gate circuit.

FIG. 1 shows a relay having a winding W and a "C" type contact spring assembly A. This type of contact assembly includes a moving leaf spring M1 which makes an electrical contact with a first stationary leaf spring S1 when the relay is released and with a second stationary leaf spring S2 when the relay is operated. Since negative battery is connected to the first stationary spring S1 and positive battery is connected to the second stationary spring S2, the potential on the moving spring M1 is negative when the relay is unoperated and positive when it is operated.

FIG. 2 shows a bistable electronic, logic gate circuit for producing the electrical function of a "C" combination relay contact assembly, among other things. In this circuit, output signals of uniform voltage are produced responsive to input pulses of substantially the same voltage. More particularly, the two principal parts of the gate circuit are a switch circuit 11 and a memory circuit 12. The switch circuit 11 is that portion of the circuit, per se, which provides the electrical function of a "C" contact spring assembly. The memory circuit 12 adds a bistable operation, i.e. if memory circuit 12 is not provided, the circuit 11 switches the polarity of its output signal responsive to the presence or absence of an input signal, and if the memory circuit 12 is provided, the circuit 11 switches to one polarity output signal responsive to an input signal and to the other polarity output signal responsive to a reset signal. When bistable operation is not required, all of the circuitry shown beneath and to the left of the dot-dashed line 14 is eliminated.

In construction, the gate circuit 11 includes input and output terminals 15, 16 respectively. Interposed between these terminals is the electronic switch circuit 11 including four semiconductor devices each of which may be an inexpensive junction type, germanium transistor, for example. More specifically, these transistors include a large signal amplifying NPN device 17 connected in common emitter configuration, a switch amplifying PNP device 18 connected in common emitter configuration, and a pair of switch amplifying transistors 19, 20 having complementary symmetry and connected in an emitter follower configuration. As the name "complementary symmetry" implies, the transistor 19 is a PNP device and the transistor 20 is an NPN device. In one exemplary construction the transistors 17, 20 are type 2N385 and the transistors 18, 19 are type 2N651.

The emitter-collector circuit of the emitter follower transistors 19, 20 are series coupled between a source of negative potential 25 and positive potential 26. The output terminal 16 is coupled to a point in this series circuit between the output or emitter electrodes of the transistors 19, 20. Therefore, if the transistor 19 is switched "on," the negative potential 25 is applied to output terminal 16 and if the transistor 20 is switched "on," the positive potential 26 is applied to the output terminal 16.

The remaining components in the switch circuit 11 include a current limiting resistor 28 and a biasing resistor 29 for applying a control or base biasing potential to the transistor 17. The emitter bias for the transistor 17 is derived from a voltage devider 30, 31 connected between ground and positive battery. A positive base bias is provided by a source of potential coupled through a resistor 32 to the base of transistor 18 while a negative base bias is provided by a source of potential coupled through a resistor 33 to the base electrodes of the transistors 19, 20. Also, the resistor 34 is coupled between the base electrode of transistor 20 and resistor 33, thereby providing additional base biasing and limiting base current flow through the transistor 20. Finally, the switch circuit 11 includes a voltage divider 35 for providing the necessary collector supply for transistors 18, 20 and the emitter bias for transistor 18. One arm of this voltage divider includes a number of diodes 36 which may be Zener type diodes to polarize and limit the current flow through the resistor 34. The circuit values are selected so that in the normal or quiescent condition (the absence of input signals), transistor 19 is switched "on" and all of the other transistors 17, 18, and 20 are switched "off."

A suitable source of input signals is here shown by a set of open contacts 40; however, it should be understood that these contacts are illustrative only and, further, that any suitable electronic, electromagnetic, or mechanical equipment may be provided to function as a source of input pulses. The point is that the transistor 17 is switched "on" when its base potential changes from ground applied through resistor 29 to the positive potential of battery 39.

The circuit operates this way. When contacts 40 are open, no positive potential is applied from source 39 to the base of transistor 17; therefore, the base is at a ground potential applied through resistor 29. The emitter of transistor 17 is at a positive potential between ground and the voltage of a (+)12 volt battery, such potential being fixed by the relative values of the resistors 30, 31. An NPN device such as this is switched "off" when its emitter is positive relative to its base electrode. At this same time (with switch 40 open) the base of transistor 18 is positive relative to its emitter because a (+)12 volt battery is connected through resistor 32 to its base electrode and (+)11.4 volts (caused by a drop of approximately 0.6 volt across the diode 42) is applied to its emitter electrode. A PNP device, such as transistor 18, is switched "off" when its emitter is negative relative to its base. The base electrode of transistor 20 is at a negative potential applied through resistors 33, 34, its collector is at approximately (+)10.2 volts applied through diodes 36 (there being about 0.6 volt drop per diode), and its emitter is at the (—)12 volts fed from battery 25 through transistor 19 to output terminal 16. Since transistor 20 is an NPN device, and further since the (—)12 volt battery 25 is positive relative to the (—)24 volt battery connected through resistors 33, 34 the transistor 20 is switched "off."

Means are provided for normally applying a first or negative polarity output signal to the load circuit in the absence of an input signal. That is, the emitter of transistor 19 is at a voltage fixed by the ground potential applied through the load circuit 41 and its base electrode is at a potential of approximately (—)12.2 volts fixed by the (—)24 volt battery connected through the resistor 33. Therefore, the emitter of transistor 19 is positive relative to its base and it is switched "on." With transistor 19 switched "on," the negative voltage of source 25 is applied through the emitter-collector circuit and the output terminal 16 to the load 41. Since an emitter follower such as transistor 19 conducts at slightly less than unity amplification, the circuit values may be chosen to reduce the (—)12.2 volts to a (—)12 volts which is applied to terminal 16.

Means are provided for switching the polarity of the potential applied to output terminal 16 when an input pulse is received at input terminal 15. Specifically, the input pulse is here shown as a (+)12 volt potential applied through closed switch 40. When this (+)12 volts is applied to the base of transistor 17, it becomes positive relative to the emitter, thus switching the transistor "on." The potential appearing at the junction of resistors 30, 31 is applied through the emitter-collector circuit of transistor 17 to the base electrode of transistor 18 which goes negative relative to the (+)11.4 volts applied through the diode 42 to the emitter, thus switching the transistor 18 "on." With transistor 18 switched "on," the potential applied to the base electrode of transistor 19 goes to the approximately (+)11.4 volts applied through diode 42 and the emitter-collector circuit of transistor 18. The emitter of transistor 19 is now negative with respect to its base and, therefore, it switches "off." At this same time, the (+)11.4 volts is applied through resistor 34 to make the base of transistor 20 positive relative to its emitter; therefore, it switches "on." With transistor 20 switched "on," the positive potential of battery 26 is applied to the output terminal 16.

Means are provided for controlling the potential magnitude of the output signals which appear at the output terminal when a signal is present at input terminal, i.e. with transistor 20 switched "on." More particularly, the magnitude of this potential is controlled by the magnitude of the potential appearing at the junction point *j* of the voltage divider 35. The potential at this point is, in turn, fixed by the number of diodes 36 which are series connected between the battery 26 and the collector of transistor 20. Specifically, there is approximately a 0.6 volt drop through each of these diodes; therefore, assuming that the battery 26 is (+)12 volts and with three diodes connected in the series circuit (as shown in FIG. 1), approximately (+)10.2 volts is applied through the collector-emitter circuit of transistor 20 to the output terminal 16. If four diodes are used, approximately (+)-9.6 volts appear at terminal 16. In a similar manner, any number of diodes may be added to or removed from this series circuit to change the potential at terminal 16 in 0.6 volt increments. A particular advantage resulting from the use of these diodes is that the voltage drop across them does not change appreciably with fluctuations in current through them. Therefore, the potential appearing at point 16 is very stable despite fluctuations of current in the Load circuit connected thereto.

When the input pulse is removed by opening switch 40, the transistors return to their previously described condition and the potential at point 16 goes back to that of the negative source 25. Thus, it is seen that closing switch 40 is similar to energizing a relay winding and, further, that the switching provided by transistors 19, 20 is similar to that produced by a "C" combination of relay contacts.

An advantage of this invention is that the gate circuit both produces twelve volt output signals of one polarity and responds to twelve volt input signals of either polarity. This is desirable because the electronics industry has standardized on twelve volt pulses to control logic circuit modules. Finally, the gate circuit produces output signals of an opposite polarity having a potential magnitude which is fully controllable and very stable. This is desirable because circuit components must be powered by a stable, controlled potential if they are to respond to twelve volt pulses. Obviously, the same principles may be followed if a standard control pulse having other than twelve volts is adopted.

Means are provided for changing the electronic gate circuit into a bistable circuit which changes output signal polarities responsive not to the presence or absence of input pulses, but responsive to successive trigger and reset signals. This is accomplished by adding the memory circuit 12 to the switch circuit 11. The principal components of the memory circuit are a differentiating circuit 45, an "OR" circuit 46, and a feedback circuit 47.

The differentiating circuit 45 includes trigger terminal 48, a switch 49, a current limiting resistor 50, a capacitor 51, and a pair of resistors 52, 53. When the switch 49 is closed momentarily, current flows through resistor 50 to charge capacitor 51. Immediately thereafter, the charge leaks off to ground through the resistors 52, 53 thereby providing a positive spike pulse.

The principal parts of the "OR" circuit 46 are a transistor 55, here shown as an NPN junction device connected in a common emitter configuration. The base bias for the transistor 55 is provided by a negative battery connected to a resistor 56 and by a number of resistors normally connected to open contacts (one resistor being shown at 57 and one open contact being shown at 58). Thus, with all of the contacts of the "OR" circuit open, the base electrode of the transistor 55 is at the potential of the (—)12 volt battery applied through the resistor 56, the emitter is at ground potential, and the collector is at the ground potential applied through the resistors 29, 53. When a NPN transistor is so biased, it is switched "off." An advantage in using this "OR" circuit is that the gate circuit may be reset from any of a number of controlling circuits.

The feedback loop circuit 47 includes a current limiting resistor 60, and an isolating diode 61, series connected between points 63 in the memory circuit and 64 in the switch circuit 11. The diode 61 is poled to conduct only when switch amplifier 18 is turned "on" and the (+)11.4 volt potential of source 26 is applied to the common biasing circuit at point 64. This potential constitutes a holding potential which is fed back over loop 47 to the input terminal when the polarity of the output signal is reversed.

In carrying out this invention, the switch circuit 11 operates in a bistable manner responsive to signals applied through the trigger terminal 48 and "OR" gate 46. More particularly, these signals are here applied in the form of a (+)12 volt battery pulse which is differentiated to drive the base of transistor 17 momentarily positive relative to its emitter thereby switching the transistor 17 "on." There is no effect at the transistor 55 and the diode 61 prevents any effect at the point 64. The transistor 17 switches "on" thus turning "on" the transistor 18. Responsive thereto, a circuit is completed for holding "on" the transistors 17, 18, such circuit being traced from the (+)12 volt battery 26 through diode 42, the emitter-collector of transistor 18, point 64, diode 61, resistor 60, and point 63 to the base of transistor 17. The potential at point 16 is switched from the (—)12 volt of source 25 to the (+)12 volt of source 26 (dropped through diodes 36) and it remains so switched until the occurrence of a reset pulse.

To return the polarity of the output terminal to normal, the reset pulse is applied through a contact in the "OR" circuit, such as that shown at 58. Responsive thereto, a (+)12 volt battery pulse is applied to the base of the switch amplifying transistor 55 via resistor 57, which switches "on." Obviously, closure of any other contacts in the "OR" circuit produces the same results. When transistor 55 switches "on," its emitter ground appears at the point 63 but not at point 64 owing to the presence of the isolating diode 61. The base of transistor 17 goes to this ground potential and it switches "off" because its emitter is positive relative to its base. When transistor 17 switches "off," transistor 18 also switches "off," thereby terminating the flow of current through the feedback loop 47. As transistor 18 switches "off," transistor 19 switches "on" and transistor 20 switches "off," thus changing the potential at the output terminal 16 from that of the (+)12 volt battery 26 to that of the (—)12 volt battery 25. Hence, it is seen that inclusion of the memory circuit 12 changes the function of the electronic gate circuit from that of a simple "C" combination to that of a bistable flip-flop circuit having output signals of opposite polarity.

It is to be understood that the foregoing description of a specific embodiment of the invention is not to be construed as a limitation on its scope.

I claim:

1. A bi-directional electronic switching circuit comprising input terminals and an output terminal, means comprising a pair of complementary transistors connected in emitter-follower configuration to said output terminal normally biased to provide potentials of one polarity with respect to ground to said output terminal, NPN transistor switching means connected to said input terminal and operated responsive to an input signal pulse of one polarity to conduct, PNP transistor switching amplifier means connected to conduct responsive to said NPN transistor switching means conducting, means responsive to said PNP transistor switching means operated to conduct for changing the bias on said complementary transistors switching said transistors to provide potential of an opposite polarity with respect to ground to said output terminal, means for regulating the potential of said opposite polarity, non-reactive feedback means connected from the output of said PNP transistor to the input of said NPN transistor switching means to maintain said transistors conducting responsive to said input signal pulse, means for resetting said switching circuit comprising a plurality of input terminals, a differential circuit connected to at least one of said input terminals for applying a sharp pulse of an opposite polarity to the input of said NPN transistor switching means and said reset means comprising a transistorized OR gate connected to at least another one of said input terminals for applying a signal of an opposite polarity to said input of said NPN transistor switching means.

2. An electronic gate circuit for selectively providing positive and negative potentials, input and output terminals, a pair of complementary symmetry transistors connected in emitter follower configuration, each of said transistors having at least a base, a collector and an emitter electrode, means for coupling the bases of said transistors to a common biasing point to cause a first of said transistors to normally conduct and a second of said transistors to normally be blocked, means for coupling the collector electrodes of said first and second transistors to said negative and positive potentials respectively, means for coupling the said emitter electrodes to said output terminal, whereby said negative potential is normally applied to said load through said first transistor, a third transistor operated responsive to steady state input signals at said input terminal for selectively switching said first transistor to a blocked condition and said second transistor to a conducting condition to switch the polarity of said output signal and maintaining said switched polarity only while said input signals are applied, and reset means connected to said common biasing point operated responsive to receipt of reset signals for switching said first transistor to normally conduct and said second transistor to said normally blocked condition.

3. In the electronic gate circuit of claim 2 wherein said third transistor is operated responsive to pulsed signals, non-reactive memory means connected from said common biasing point to the input of said third transistor for maintaining said switched potential at said output, said memory means comprising a feed back path for feeding back a signal to hold said output signal at said switched polarity, and means responsive to receipt of a reset signal for terminating said feed back signal thereby returning the polarity of said output terminal to normal.

References Cited in the file of this patent

UNITED STATES PATENTS

| | | |
|---|---|---|
| 2,789,164 | Stanley | Apr. 16, 1957 |
| 2,831,113 | Weller | Apr. 15, 1958 |
| 2,871,378 | Lohman | Jan. 27, 1959 |
| 2,888,579 | Wanlass | May 26, 1959 |
| 3,009,070 | Barnes | Nov. 14, 1961 |

OTHER REFERENCES

Design of Transistor CKts for Digital Computers, by Pressman Rider, 1959, page 11–292 TK 7888.3P7.